United States Patent [19]

Baird et al.

[11] 4,279,726

[45] Jul. 21, 1981

[54] PROCESS FOR MAKING ELECTROLUMINESCENT FILMS AND DEVICES

[75] Inventors: Donald H. Baird, Newton; Martin S. McDonough, Andover, both of Mass.

[73] Assignee: GTE Laboratories Incorporated, Waltham, Mass.

[21] Appl. No.: 162,454

[22] Filed: Jun. 23, 1980

[51] Int. Cl.³ .............................................. C23C 15/00
[52] U.S. Cl. ................................................ 204/192 P
[58] Field of Search ....................... 204/192 SP, 192 P

[56] References Cited

U.S. PATENT DOCUMENTS

| 3,803,438 | 4/1974 | Hanak | 313/108 A |
|---|---|---|---|
| 4,098,919 | 7/1978 | Morimoto et al. | 427/42 |
| 4,137,481 | 1/1979 | Hilsum et al. | 313/503 |

FOREIGN PATENT DOCUMENTS 830392  3/1960  United Kingdom ............... 204/192 SP

OTHER PUBLICATIONS

C. Misiano et al., "Co-sputtered Optical Films," *Vacuum* vol. 27, pp. 403-406 (1977).
Hanak et al., "DC Electroluminescent Flat Panel Display," U.S. Army Electronics Command R&D Report, ECOM-0290-F, Aug. 1973, pp. 13-27, 85-98.
M. I. Abdalta et al., "Low Voltage D.C. Electroluminescence In ZnS(Mn, Cu) Thin Films," *Proc. S.I.D.*, vol. 19, pp. 91-95, 3rd quarter, 1978.
J. L. Plumb, "D.C. Characteristics of Electroluminescent Evaporated ZnS:Mn, Cu, Cl Films," *Japan J. Appl. Phys.*, vol. 10, pp. 326-331 (1971).
W. A. Thornton, "D.C. Electroluminescence In Zinc Sulfide Films," *J. Appl. Phys.*, vol. 33, pp. 3045-3048 (1962).
J. J. Hanak, "Electroluminescence in $ZnS:Mn_x:Cu_y$ RF-Sputtered Films," *Proc. 6th Int'l. Vacuum Congr., Japan J. Appl. Phys.*, Suppl. 2, Pt. 1 (1974), pp. 809-812.

*Primary Examiner*—Aaron Weisstuch
*Attorney, Agent, or Firm*—William R. McClellan

[57] ABSTRACT

A process for making electroluminescent films and devices by sputtering. Zinc sulfide, manganese, and copper sputtering targets are arranged in a circular configuration. RF voltages, applied to the targets, cause sputtering of the target materials. A transparent substrate with a transparent electrode formed thereon is rotated beneath the sputtering targets. An electroluminescent film including the target materials is formed on the upper surface of the transparent electrode. Concentration of the target materials in the electroluminescent film can be controlled by controlling the rf voltages applied to the sputtering targets. An electroluminescent device is completed by depositing a second electrode on the upper surface of the electroluminescent film and applying a forming voltage between the electrodes.

5 Claims, 3 Drawing Figures

PROCESS FOR MAKING ELECTROLUMINESCENT FILMS AND DEVICES

BACKGROUND OF THE INVENTION

This invention relates to a method for making thin film electroluminescent devices and, more particularly, to a sputtering method for producing electroluminescent films and devices which are operable at low dc voltages.

Electroluminescent devices which can be operated at low dc voltages are useful because of their compatibility with integrated circuit devices. Furthermore, such devices can be operated from batteries without the hazard associated with higher operating voltages. Various phosphor materials have been used in dc electroluminescent devices. Also, various methods have been utilized to fabricate dc electroluminescent devices. Thornton, *Journal of Applied Physics*, Volume 33, pp. 3045–3048, 1962, and later Plumb, *Japanese Journal of Applied Physics*, Volume 10, pp. 326–331, March 1971, evaporated ZnS:Mn, Cu, Cl phosphor materials, on a glass substrate coated with tin oxide or indiumtin oxide. Abdalla and Thomas, *Proceedings of the S.I.D.*, Volume 19/3, pp. 91–95, 1978, prepared films of ZnS:Mn, Cu by evaporating Zn, S, Mn, and Cu onto a tin oxide or indium-tin oxide coated glass substrate from separate sources.

Sputtering of electroluminescent cells was described by Hanak in *Proc. 6th Internl. Vacuum Congr.*, 1974, *Japanese Journal of Applied Physics Suppl.* 2, Pt. 1, pp. 809–812, 1974. One disclosed method of making electroluminescent films consists of sputtering from a composite target of zinc sulfide having numerous squares of manganese and copper placed over it in a regular pattern. The resulting electroluminescent film composition is determined by the relative areas of the manganese, copper, and zinc sulfide in the composite target. Another disclosed method, found to be undesirable, utilizes a premixed powder target of the desired composition.

One disadvantage of fabricating electroluminescent devices by evaporation or by the above-described sputtering techniques is the difficulty in maintaining close control over the stoichiometry and doping levels of the electroluminescent film. The composition of the electroluminescent film is critical in establishing its operating parameters. A further disadvantage of the above-described methods is the inability to produce a graded dopant profile within the electroluminescent film.

SUMMARY OF THE INVENTION

It is a general object of the present invention to provide new and improved methods for producing electroluminescent films and devices.

It is another object of the present invention to provide new and improved methods for preparing electroluminescent devices which can be operated at low dc voltages.

It is yet another object of the present invention to provide new and improved methods for producing electroluminescent devices wherein the stoichiometry and doping levels of the electroluminescent film can be closely controlled.

It is yet another object of the present invention to provide new and improved methods for producing electroluminescent films wherein a graded dopant profile can be provided.

According to the present invention, these and other objects and advantages are achieved in a method for making an electroluminescent film which is the light-producing portion of an electroluminescent device. A plurality of discrete sputtering targets, each of a predetermined area and a predetermined material, and a substrate are placed in a vacuum-tight vessel containing a gas at a pressure suitable for sputtering. Voltages which cause sputtering of the target materials at predetermined rates are applied to the targets. Relative motion between the substrate and the sputtering targets is caused to occur such that the substrate is sequentially exposed to the targets and the target material are sequentially sputtered onto the substrate. An electroluminescent film, including material from each of the targets, is thereby formed on the substrate. According to one preferred method of practicing the invention, the targets are arranged in a generally circular configuration and the substrate is rotated sequentially into proximity to each of the sputtering targets. The substrate can be heated as it is sequentially moved into proximity to the sputtering targets.

For a better understanding of the present invention, together with other and further objects, advantages, and capabilities thereof, reference is made to the following disclosure and appended claims in connection with the above-described drawings.

DETAILED DESCRIPTION OF THE INVENTION

DC electroluminescent devices typically include a thin electroluminescent film between a pair of electrodes. The electroluminescent film is the light-producing portion of the device. One of the electrodes is transparent to permit escape of light from the device. A transparent substrate provides mechanical support for the device.

Figure 1:
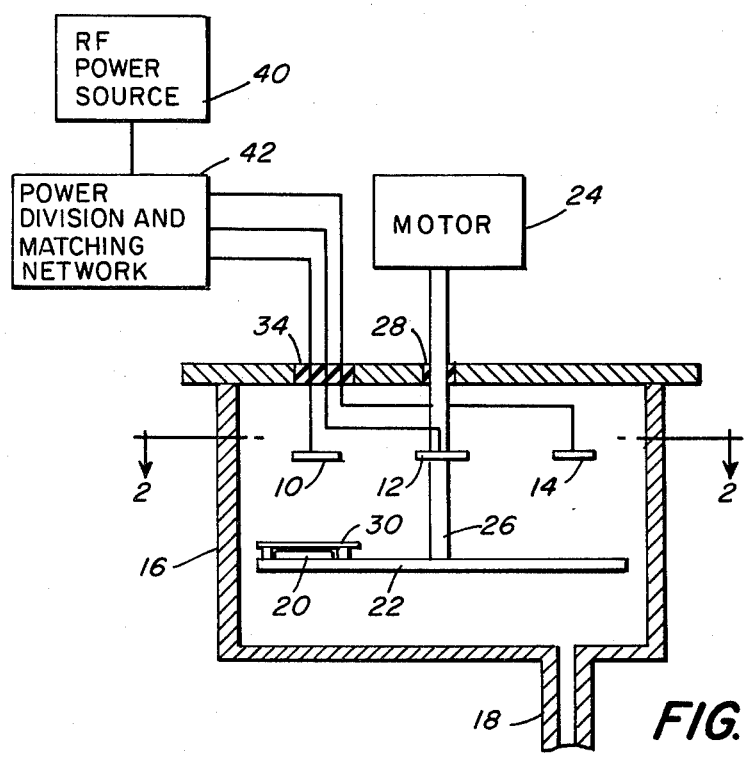
FIG. 1 is a simplified schematic elevational view of an apparatus for making electroluminescent films according to the method of the present invention.
Figure 2:
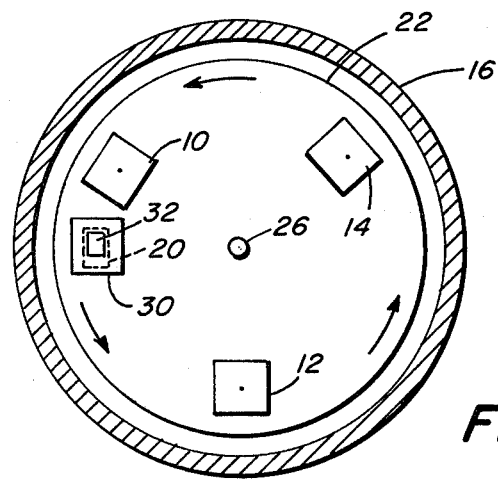
FIG. 2 is a top view of the apparatus of FIG. 1 taken along the line 2—2 thereof.

An apparatus for making electroluminescent films by sputtering according to the method of the present invention is illustrated in FIGS. 1 and 2. The essential components of the apparatus are shown in simplified form for ease of understanding. The electroluminescent film in the present example is zinc sulfide doped with manganese and copper. A zinc sulfide target 10, a manganese target 12, and a copper target 14 are placed in a vessel 16 which can be evacuated through a port 18 and filled with a suitable gas at low pressure. The gas is ionized during sputtering. One preferred gas is argon at a pressure in the range of 5 to 20 microns. A substrate 20 is placed on a turntable 22 which is located within the vessel 16 and is located in proximity to the targets 10, 12, and 14. In the present example, the targets 10, 12, and 14 are placed in a generally circular configuration above the turntable 22 as shown in FIG. 2. The substrate 20 is placed at a point on the turntable 22 such that it passes beneath each of the targets 10, 12, and 14 when the turntable 22 is rotated. The substrate 20 is typically glass coated with a transparent electrode such as tin oxide or indium-tin oxide. The turntable 22 is coupled to a motor 24 external to the vessel 16 by a shaft 26. The shaft 26 passes through a vacuum-tight feedthrough 28 in the wall of the vessel 16. When the motor 24 is operating, it causes the turntable 22 and the substrate 20 to rotate. Thus, the substrate 20 is moved successively into proximity to the targets 10, 12, and 14 as it rotates. A mask 30 can be positioned between the substrate 20 and the targets 10, 12, and 14. The mask 30, as shown in FIG. 2, exposes portions of the substrate 20 while masking the remainder of the substrate 20. In the example shown in FIG. 2, a rectangular aperture 32 in the mask 30 exposes a rectangular portion of the substrate 20. Clearly, the aperture 32 can have any desired shape and can be used to form patterns such as alphanumeric characters.

A radio frequency (rf) power source 40 has its output coupled to the input of a power division and matching network 42. The network 42 has three outputs, one coupled to each of the three targets 10, 12, and 14. The power source 40 and the power division and matching network 42 are located external to the vessel 16. Therefore, the outputs of the network 42 are coupled to the targets 10, 12, and 14 through one or more vacuum-tight feedthroughs 34 in the wall of the vessel 16. The rf power source 40 provides an output power of approximately 200 to 1000 watts at a typical frequency of 13.5 MHz. The power division and matching network 42 splits the output of the power source 40 into three separate outputs and provides separate adjustments on the level of power supplied to each of the targets 10, 12, and 14. Furthermore, the network 42 provides impedance matching between the targets 10, 12, and 14 and the rf power source 40. An alternative, but more expensive, approach is to use a separate rf power source for each target.

In operation, rf voltages are applied to the zinc sulfide target 10, the manganese target 12, and the copper target 14, thereby causing sputtering of the target materials as is well known to those skilled in the sputtering art. The substrate 20 is rotated by the motor 24 so as to pass sequentially and repeatedly underneath each of the targets 10, 12, and 14. A preferred angular speed is 5 r.p.m. As the substrate 20 passes beneath each target, a thin layer of the target material is deposited on the upper surface of the transparent electrode on the substrate 20, thereby gradually forming an electroluminescent film. Several hours of the sputtering process are required to form an electroluminescent film of about a micron in thickness. After completion of the electroluminescent film by sputtering, a second electrode, typically aluminum, is deposited on the upper surface of the electroluminescent film by known methods such as sputtering or evaporation.

Figure 3:
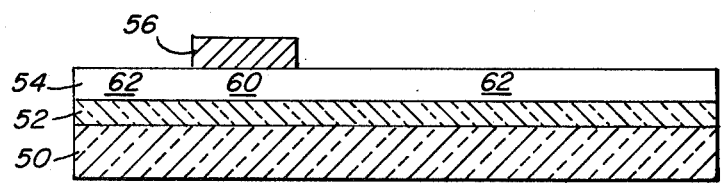
FIG. 3 is a cross-sectional view of an electroluminescent device fabricated in accordance with the method of the present invention.

An electroluminescent device fabricated in accordance with the present invention is illustrated in FIG. 3. As described hereinabove, the substrate includes a transparent material 50 such as glass which provides mechanical rigidity for the device with a transparent electrode 52 deposited thereon. The transparent electrode 52 is typically tin oxide or indium-tin oxide. The phosphor or electroluminescent film 54 is formed by sputtering in the apparatus shown in FIGS. 1 and 2. The electroluminescent film 54 can be any thickness greater than about 0.5 micron and is typically 1 to 1.5 microns in thickness. A second electrode 56, such as aluminum, is formed on the upper surface of the electroluminescent film 54.

Referring again to FIGS. 1 and 2, a thin layer of the target material is deposited on the substrate 20 each time the substrate 20 rotates underneath the respective target. One would expect the phosphor film formed by sputtering during rotation to include very thin repetitive layers of target material. However, actual devices thus formed show no signs of layering. Because of the rotation rate of about 5 r.p.m., the thickness deposited per revolution is less than 10 angstroms which is comparable to the lattice spacing of zinc sulfide. Furthermore, the substrate 20 is typically heated to a temperature of about 250° C. during the sputtering process. Therefore, diffusion provides further leveling of local non-uniformities of composition.

As noted hereinabove, the host material is zinc sulfide while the copper and manganese are dopants. Typically, the dopant levels do not exceed a few weight percent. The concentration of each dopant in the electroluminescent film can be controlled by varying the voltage applied to the sputtering target. When non-uniform dopant concentration is desired, the voltage applied to the dopant targets is varied during the sputtering process, either continuously or in steps. Alternatively, or in combination with voltage control, the dopant concentration in the electroluminescent film can be controlled by varying the area of the target exposed to the substrate. It was determined that copper concentrations in the range between one weight percent and two weight percent were required to produce an electroluminescent device with suitable electroluminescent performance at operating voltages of less than 30 volts dc. This was achieved by applying rf voltages greater than 350 volts to the copper target. The manganese concentration is typically in the range between 0.1 weight percent and 1.0 weight percent.

While the above-described process for making electroluminescent films and devices has been described in connection with zinc sulfide doped with manganese and copper, the same method is applicable to other host materials, for example, zinc selenide or cadmium sulfide and to other dopants, such as aluminum or rare earth elements. The number of sputtering targets and the material of the targets are determined by the desired composition of the electroluminescent film. Also, for greater efficiency, multiple electroluminescent devices can be simultaneously fabricated by the placement of multiple substrates on the rotating turntable.

While rotation of the substrate beneath the sputtering targets is most convenient, any sequential motion into proximity to the sputtering targets can be used. For example, a linear reciprocating movement of the substrate relative to sputtering targets placed in a linear arrangement can be utilized. The important feature is relative movement between the substrate and the sputtering targets so that the substrate is sequentially moved into proximity to, or exposed to, each target. Thus, in an equivalent method for making electroluminescent devices, the substrate is stationary and the sputtering targets are rotated. Due to the relative movement between the substrate and the sputtering targets, the targets can be spaced apart at any convenient distance and be placed in any convenient arrangement. The requirement is for compatibility between the target arrangement and the substrate movement so that the substrate is sequentiallly moved into proximity to, or exposed to, each target. electrical resistance of the device. This apparently results from the formation of a thin insulating layer within the phosphor film across which the voltage drop becomes concentrated with the consequent generation of electroluminescence. The formation of the insulating region is believed to be due to the electrically induced migration of copper away from the anode. Although either polarity can be used, the preferred polarity for forming and operating the electroluminescent devices is with the aluminum electrode positive relative to the tin oxide electrode. Depending on the copper concentration and distribution within the electroluminescent device, the threshold for forming falls between 3 and 10 volts while the corresponding current densities range from 2 to 6 amps per square centimeter. After forming, dc operating voltages between 10 and 30 volts produce a brightness of 5 foot-lamberts or more. One example of an electroluminescent device fabricated in accordance with the above-described method and having an area of 0.008 square centimeter required 9.5 volts and 50 milliamps to initiate forming. During the process of forming, the voltage was brought up to 25 volts while the current decreased to 15 milliamps. At that time, the brightness was 8.0 foot-lamberts. After aging for 16 hours at 25 volts, the current further decreased to 6.4 milliamps and the brightness decreased to 3.0 foot-lamberts.

When the Cu doping level in Cu and Mn doped ZnS electroluminescent devices prepared in accordance with the above-described method exceeds 1.5 weight percent, the electroluminescent film absorbs incident light and is opaque rather than transparent, thus providing a device with good contrast. The color of the film is charcoal or gray-black. Electroluminescent films having a thickness of 1.0 to 1.5 microns are opaque and have a resistivity of approximately $10^3$ ohm-centimeters.

As described hereinabove, forming of dc electroluminescent devices by application of an increasing dc voltage is required. Referring again to FIG. 3, when the electroluminescent device illustrated therein has a Cu concentration in the film 54 between 1.5 and 2.0 weight percent, the film 54 is opaque prior to forming. After completion of the forming process, a luminescent region 60 of the film 54 contiguous the second electrode 56 becomes bleached or less opaque. The luminescent region 60 is the portion of the film 54 which provides illumination during operation of the device. A surrounding region 62 of the film 54, not contiguous the second electrode 56, retains its light absorbing properties after forming. Thus, during operation there is good contrast between the luminescent region 60 and the surrounding region 62 which is light absorbing.

Due to the bleaching of the luminescent region 60 of the electroluminescent film 54 which occurs during forming, the second electrode 56 can become visible when the device is de-energized. When visibility of the second electrode 56 is unacceptable, the film 54 can be made less transparent by making it thicker without affecting its electroluminescent properties. Another approach is to utilize a black second electrode, such as titanium nitride, so that the entire area of the de-energized device is light absorbing.

Thus, there is provided by the present invention a method for producing low voltage dc electroluminescent devices wherein the stoichiometry and doping levels of the electroluminescent film can be closely controlled. Furthermore, there is provided an electroluminescent device which has good contrast but which does not include an additional black or dark field layer.

While there has been shown and described what is at present considered the preferred embodiment of the present invention, it will be obvious to those skilled in the art that various changes and modifications may be made therein without departing from the scope of the invention as defined by the appended claims.

What is claimed is:

1. A method for making a low voltage dc electroluminescent film comprising the steps of:
    placing a plurality of discrete sputtering targets, including a zinc sulfide target, a manganese target, and a copper target, and a substrate in vacuum-tight vessel containing a gas at a pressure suitable for sputtering, said targets being placed in a circular arrangement;
    applying to said targets voltages which cause sputtering of said target materials;
    rotating said substrate sequentially into proximity to each of said sputtering targets such that said substrate is sequentially exposed to said targets, said target materials are sequentially sputtered onto said substrate and an electroluminescent film, including material from each of said targets, is formed on said substrate; and
    controlling the rate of sputtering of said copper target so as to provide a copper concentration in said electroluminescent film in the range between one weight percent and two weight percent,
    whereby said electroluminescent film is operable at low dc voltages.

2. The method as defined in claim 1 wherein said substrate is rotated at a rate of about 5 r.p.m. and is heated during rotation so as to cause leveling by diffusion of local non-uniformities of composition of said electroluminescent film.

3. The method as defined in claim 1 wherein said electroluminescent film has a thickness in the range between 1.0 and 1.5 microns.

4. A method for making a low voltage dc electroluminescent device comprising the steps of:
    placing a plurality of discrete sputtering targets, including a zinc sulfide target, a manganese target, and a copper target, and a substrate having a transparent electrode formed thereon in a vacuum-tight vessel containing a gas at a pressure suitable for sputtering, said targets being placed in a circular arrangement;
    applying to said targets voltages which cause sputtering of said target materials;
    rotating said substrate sequentially into proximity to each of said sputtering targets such that said substrate is sequentially exposed to said targets, said target materials are sequentially sputtered onto said substrate and an electroluminescent film, including material from each of said targets, is formed on said substrate;
    controlling the rate of sputtering of said copper target so as to provide a copper concentration in said electroluminescent film in the range between one weight percent and two weight percent;
    forming a second electrode on said electroluminescent film; and
    applying between said electrodes a voltage of sufficient magnitude to create an insulating layer in said electroluminescent film,
    whereby an electroluminescent device operable at low dc voltages is provided.

5. The method as defined in claim 4 wherein said substrate is rotated at a rate of about 5 r.p.m. and is heated during rotation so as to cause leveling by diffusion of local non-uniformities of composition of said electroluminescent film.

* * * * *